United States Patent [19]

Sirkin

[11] Patent Number: 5,450,222

[45] Date of Patent: Sep. 12, 1995

[54] ELECTRICAL CONNECTION OF DEVICES INCORPORATING MULTIPLE LIQUID CRYSTAL CELLS

[75] Inventor: Eric R. Sirkin, Palo Alto, Calif.

[73] Assignee: Apple Computer, Inc., Cupertino, Calif.

[21] Appl. No.: 68,022

[22] Filed: May 27, 1993

[51] Int. Cl.⁶ .................. G02F 1/1343; G02F 1/133
[52] U.S. Cl. ........................................ 359/88; 359/53
[58] Field of Search ........................... 359/88, 53, 83

[56] References Cited

U.S. PATENT DOCUMENTS

| | | | |
|---|---|---|---|
| 4,549,174 | 10/1985 | Funada et al. | 359/53 |
| 5,029,984 | 7/1991 | Adachi et al. | 359/88 |
| 5,042,919 | 8/1991 | Yabu et al. | 359/88 |
| 5,124,818 | 6/1992 | Conner et al. | 359/53 |
| 5,168,384 | 12/1992 | Genba | 359/88 |
| 5,293,262 | 3/1994 | Adachi et al. | 359/88 |

FOREIGN PATENT DOCUMENTS

2062928 5/1981 United Kingdom .

OTHER PUBLICATIONS

Proceedings of the 41st Electronic Components and Technology Conference, Atlanta, Ga., USA, May, 1991, pp. 355–361.
Solid State Technology, vol. 36, No. 1, Jan. 1993, Washington, US pp. 63–66–70–71.

Primary Examiner—William L. Sikes
Assistant Examiner—Kenneth Parker
Attorney, Agent, or Firm—Burns, Doane, Swecker & Mathis

[57] ABSTRACT

A method for connecting liquid crystal shutters. Multiple flat panel display cells each having opposed active and common substrates are fixed in overlapping relation to one another with each of the active and common substrates having multiple electrodes defined thereon. Multiple heat seal connectors are provided each having conductive paths defined thereon. Each heat seal connector is connected to one of the active and common substrates. Multiple ones of the heat seal connectors are connected to the same printed circuit, which may have a terminating header connector. Connections to a display of the type described are made by placing a display cell in a heat sealing machine, placing a heat seal connector over an edge of an active substrate of the display cell, bringing a heat fixture into contact with the heat sealing connector to heat seal the connector to the substrate, turning over the display cell and replacing the display cell in the heat sealing machine, placing the heat seal connector over an edge of a common substrate of the display cell, bringing a heat fixture into contact with the heat seal connector to heat seal the connector to the substrate, and repeating the foregoing steps for one or more additional display cells. Multiple display cells are then fixed in overlapping relation to one another.

12 Claims, 2 Drawing Sheets

ELECTRICAL CONNECTION OF DEVICES INCORPORATING MULTIPLE LIQUID CRYSTAL CELLS

BACKGROUND OF THE INVENTION

Field of the Invention

The present invention relates to electrical connection of devices incorporating multiple liquid crystal cells, in particular liquid crystal shutters.

State of the Art

The most common color display device in the information display industry is presently the color RGB (Red, Green and Blue) cathode ray tube. Three independent electron beams are rastered in a vacuum across the innersurface of the faceplate of a cathode ray tube. The modulated current from each electron beam causes one of three phosphors to luminesce. The viewer spatially integrates the color emissions from these three pigments to then form a full color image.

Another approach to producing color images for information displays is to use a pixel addressed (rasterized or non-rasterized) "whim light" display device with a color filter placed between the image-creating device and the viewer. By moving different color filters in front of the imaging device, what is perceived at the viewer as a full color image can be produced. The "white light" source is refreshed at three times the normal refresh rate so as to allow the integration of the three separate primary color images into a single image over time, consistent with human visual perception. The color placed before the viewer must be synchronized with the refresh of the "white light" source so as to create the single integrated color image perceived by the viewer.

Given the required refresh rates (180 Hz per primary color), the use of a filter requiring physical motion is impractical. Instead, an electrically switchable color filter may be placed between the "white light" source and the viewer. Known Liquid Crystal Shutter (LCS) technology provides the function of an electrically switchable color filter. The liquid crystal shutter therefore provides an electrically activated means for generating a time sequentially converged color image from a "monochrome" raster display device such as a CRT.

In a liquid crystal shutter, two liquid crystal "$\pi$-cells", each of which incorporates an electrically alterable birefringent liquid crystal sandwiched between two plates of glass, provide the ability to fix four states of polarization of linearly polarized light. Each cell when electrically activated passes light unaltered, and when not activated (in a standby condition) produces light polarization with a rotation of 90°. By electrically switching the two cells the LCS can reliably function as a color filter alternating between the three primary colors Red, Green and Blue.

The LCS color switching is synchronized with the refresh of the image on the "white light" source so that the viewer integrates the colors over time (rather than space) to "see" a full color image. By incorporating dichroic polarizing sheet polarizers having the appropriate band pass transmissions in the visible wavelength region, it is possible to control the color transmitted by electrically controlling the angle of linear polarization of the transmitted light. As shown in FIG. 1, two electrically switchable polarization cells 10 and 20, formed by liquid crystal cells 12 and 14, respectively, together with the appropriate polarizers 11, 13, 15, 17 and 21 are incorporated into a single LCS 30. Since there are two cells each of which can be placed in one of two polarization states, the LCS device can generate any one of four display states. An anti-reflection-coated cover glass 31 is not necessary to produce the color image but aids in the overall system performance by reducing stray reflections from the front surface.

The most suitable means for generating the pixel addressed "white light" image is through the use of a monochrome CRT. The monochrome CRT can produce the appropriate brightness and can be controlled by a standard analog circuitry. Since the timing for the screen refresh is critical in order to maintain consistency with existing video standards, each $\pi$-cell is divided into several (for example eight) horizontal electrically isolated electrodes 41 as seen in FIG. 2. Each electrode is switched on to synchronize each primary color screen refresh with the vertical raster of the CRT. The horizontal segments 41 are electrically isolated by etching away a thin line of a conductive Indium Tin Oxide (ITO) film which forms the electrodes on the glass surface of the $\pi$-cells. This narrow gap between horizontal segments is less than 20 um wide and therefore is not visible to the human eye. Electrical contact can then be made to each segment in connecter contact areas 43 using any of a variety of different technologies. A glue seal line 45 separates the connector contact area 43 from the viewed area 47.

Technologies for attaching leads to Indium Tin Oxide on glass have existed for some time. These technologies range from simple 0.1" pitch lead frames used in segmented twisted nematic type LCDs to 150 um pitch flexible printed circuits. In the case of lead frames, clips are attached to the edge of the glass, epoxied into place with a conductive adhesive and then trimmed and formed. For low lead counts typical of segmented type displays like those found in instruments, pagers, telephones, etc., this technology is well-suited to the application and lends itself to automated assembly and low material costs.

Matrix addressed devices like those typically found in PC notebooks, on the other hand, require very fine pitch attachment technologies. Two types of connection schemes have found wide usage in this application. Greater reliability may be obtained at greater cost using Flexible Printed Circuits (FPCs). A conductive (anisotropic) adhesive tape is used to provide a mechanical and electrical connection between the FPC and the ITO coated glass. During assembly the conductive tape is applied across the ends of the coated surface of the glass and the FPC is laid over it. Heat (about 200° C.) is applied for 10 to 20 seconds during which the FPC forms a mechanically sound, low-resistance contact to the coated glass. Another common technology employs Heat Seal Connectors (HSCs). Heat seal connectors are polyester-backed films with silver or graphite-based conductive films screen-printed on the surface. The HSC is coated with a conductive resin that forms a short circuit to the coated glass. No anisotropic tape is required, and the overall assembly and materials costs are substantially lower. The HSC technology suffers a slight penalty in film conductivity, reliability and pixel pitch in comparison to the FPC approach.

The problem of providing an inexpensive, reliable connection solution for LCSs and the like that is well-suited to volume production has not been addressed in the prior art. When compared to other liquid crystal devices, several characteristics of the LCS make design of a connector system distinctly different. Unlike other liquid-crystal-based, high-information-content displays the LCS does not require fine pitch contacts. For the example illustrated in FIG. 2, eight contacts, each 15 mm long, are made for both glass sheets comprising a $\pi$-cell. Two separate liquid crystal cells ($\pi$-cells) each of which require multiple connections are assembled to form a shutter. Signals driving the electrodes for each $\pi$-cell require larger currents (about 80 mA RMS) and voltages (about 50 V peak to peak) compared to other liquid crystal devices. Given the 2 kHz frequencies required, lead resistances must be maintained below a few ohms in order to reduce stray noise.

All liquid crystal devices have an active and an opposing common electrode sheet panel. Typically the active panel is driven with a voltage-modulated RF signal and the common electrode is grounded. In other liquid crystal devices, the common electrode consists of a single ITO electrode. Depending upon shutter size, however, the common electrode in each $\pi$-cell may need to be segmented, for example into eight segments as shown in FIG. 2.

Referring to FIGS. 3a and 3b, and more particularly FIG. 3b, the active and common substrates of liquid crystal cells 12 and 14 are offset from one another in order to expose the ITO electrodes on one of the substrates. The ITO electrodes on the other of the substrates thus become exposed at the opposite edge of the LCS. For convenience of illustration, polarizers 11 and 13 have been represented together as polarizer 18 and polarizers 15 and 17 have been represented together as polarizer 16.

SUMMARY OF THE INVENTION

The present invention, generally speaking, provides an inexpensive, reliable connection solution for LCSs and the like that is well suited to volume production. In accordance with one embodiment of the invention, multiple flat panel display cells each having opposed active and common substrates are fixed in overlapping relation to one another with each of the active and common substrates having multiple electrodes defined thereon. Multiple heat seal connectors are provided each having conductive paths defined thereon. Each heat seal connector is connected to one of the active and common substrates. Multiple ones of the heat seal connectors are connected to the same printed circuit, which may have a terminating header connector.

In accordance with another embodiment of the invention, connections to a display of the typedescribed are made by placing a display cell in a heat sealing machine, placing a heat seal connector over an edge of an active substrate of the display cell, bringing a heat fixture into contact with the heat sealing connector to heat seal the connector to the substrate, turning over the display cell and replacing the display cell in the heat sealing machine, placing the heat seal connector over an edge of a common substrate of the display cell, bringing a heat fixture into contact with the heat seal connector to heat seal the connector to the substrate, and repeating the foregoing steps for one or more additional display cells. Multiple display cells are then fixed in overlapping relation to one another.

BRIEF DESCRIPTION OF THE DRAWINGS

The present invention may be further understood from the following written description read in conjunction with the appended drawings. In the drawings:

FIG. 3b is an enlarged view of a connector contact area of the liquid crystal shutter of FIG. 3a;

FIG. 5b is an enlarged view of one of the connector contact areas of the liquid crystal shutter of FIG. 5a;

FIG. 5c is an enlarged view of the other connector contact areas of the liquid crystal shutter of FIG. 5a.

DETAILED DESCRIPTION OF THE PREFERRED EMBODIMENTS

Figure 4:
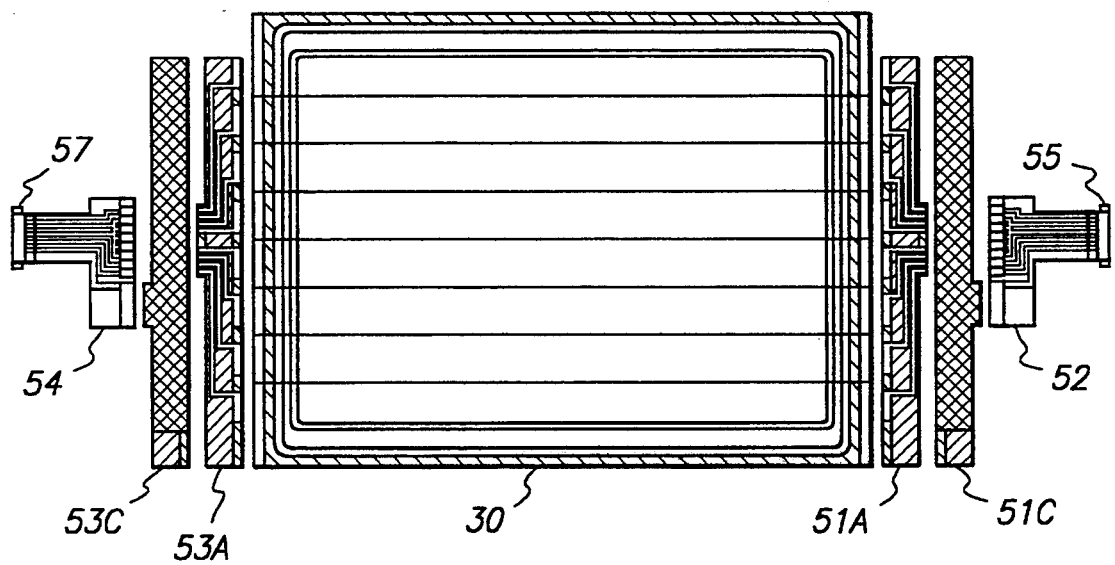
FIG. 4 is an exploded pictorial view of the liquid crystal shutter of FIG. 2 with associated electrical connectors in accordance with the present invention.

Referring to FIG. 4, in one embodiment of the invention, heat seal connectors 51A, 51C, 53A and 53C and flexible printed circuits 52 and 54 are used to make electrical connection to LCS 30. The LCS 30 is assembled from two separate, nearly identical, $\pi$-cells.

Figure 5A:
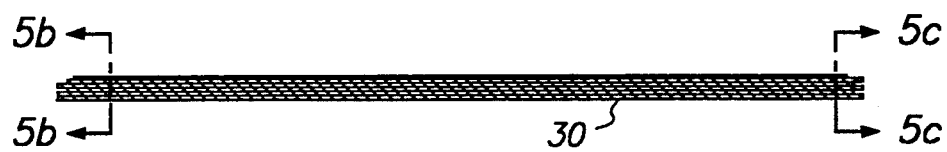
FIG. 5a is a sectional view like that of FIG. 3a of the liquid crystal shutter of FIG. 2.
Figure 5B:
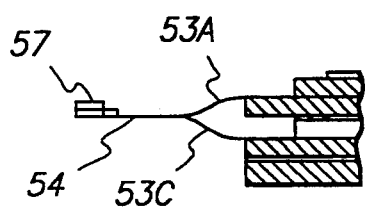
Figure 5C:
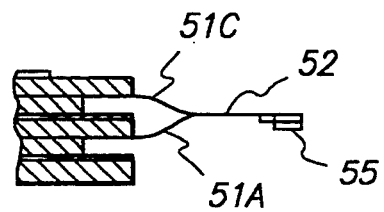

A sectional view of the LCS 30 of FIG. 4 is shown in FIG. 5a. As seen in greater detail in FIG. 5b, a connector contact area is provided along two opposite edges of the LCS. The connector contact area along one edge allows connections to be made to one ITO-coated glass plate of each of the liquid crystal cells. A connector contact area along the other edge allows contact to be made to the other ITO-coated glass plate of each of the liquid crystal cells. In section 5b, the ITO-coated glass plates with which electrical contact is made are upward facing. In Figure Section 5c C the ITO-coated glass plates to which an electrical contract is made are downward facing. In the present embodiment, the ITO electrode structure on the two glass plates of each of the liquid crystal cells is identical such that the electrodes of glass plate may serve as the active electrodes or the common electrodes. In an instance where the electrode patterns are not interchangeable, the liquid crystal cells should be arranged such that at both sides of the LCS the active electrodes of one liquid crystal cell and the common electrode of the other liquid crystal cell are accessible.

In section 5b, an "active" heat seal connector 53A is used to connect to the active electrodes of one of the liquid crystal cells and a "common" heat seal connector 53C is used to connect to the common electrodes of the other of the liquid crystal cells. A "active" heat seal connector has eight individual traces fanning out from the outer edge to make contact with the evenly-spaced horizontal segments running across the $\pi$-cell. A "common" heat seal connector, on the other hand, has defined on its surface a single broad conductive film that spans all of the evenly spaced horizontal segments running across the $\pi$-cell. The active and common heat seal connectors 53A and 53C are designed to both connect to a single flexible printed circuit board 54 having a terminating header connector 57. In section 5b of FIG. 5b, therefore, the common heat seal connector 53C connects to the common electrodes of the first (lower) liquid crystal cell and a flexible printed circuit board 54. The active heat seal connector 53A connects to the active electrodes of the second (upper) liquid crystal cell and to the flexible printed circuit board 54 having a terminating header connector 57. In section 5c, an active heat seal connector 51A connects to the active electrodes of the first liquid crystal cell and to the flexible printed circuit board 52. A common heat seal connector connects to the common electrodes of the second liquid crystal cell and to the flexible printed circuit board 52 having a terminating header connector 55. Note that the connector structure in section 5c is identical to that of section 5b except that it is turned upside down. This provides a major cost/design advantage.

Referring again to FIG. 4, the manner in which the heat seal connectors connect to the liquid crystal cells and to the flexible printed circuits may be more readily understood. For convenience of illustration, the traces and conductive areas of the flexible printed circuits and the heat seal connectors have all been shown facing upward. In actuality, the traces of the heat seal connector 53A and the flexible printed circuit 54 as well as the conductive area of the heat seal connector 53C all face downward as explained in relation to FIG. 5b.

In the case of the active heat seal connectors, silver lead traces are printed on a polyester-based film. The traces are exposed where they are to contact the ITO electrodes and where they are to contact the traces of the FPC. Elsewhere the traces are covered by a polyester resin adhesive. In the case of the common heat seal connectors, a single large area electrode trace is printed on the polyester based film. The electrode trace is exposed on top where it is to contact the common ITO electrodes and where it is to contact the FPC.

The flexible printed circuit is fabricated from polyimide. Polyamide is used since a header must be soldered to the FPC. Copper traces are defined on the FPC. On the side where the FPC terminates at the HSCs the copper traces are plated with Ni/Au for corrosion protection. At the other end the traces are coated with Pb/Sn to save on cost. The FPCs are terminated in a header which is in turn mounted into a plastic frame which forms part of the shutter.

The LCS is assembled from two separate, nearly identical, π-cells. A single π-cell is first placed in the fixture of a semiautomatic heat sealing machine. The π-cell consists of a fully assembled and tested liquid crystal cell having the polarizers laminated in place. An active heat seal connector is placed over the 3–5 mm edge of the π-cell with the traces exposed over the glass, and a heat fixture is brought down into contact over the HSC resting on the π-cell. The HSC can be aligned visually by humans by registering the bottom edge of the connector to the bottom of the π-cell. No special optical alignment tool is required. Within 6–10 seconds of applied 100°–180° C. heat, the HSC forms a solid electrical and mechanical connection to the π-cell.

After the first seal operation, the π-cell is removed from the heat seal machine and flipped so that the other side of the π-cell is exposed on top. The common HSC is aligned manually over the exposed electrodes on the glass by registering the bottom edge with the glass edge. The common HSC electrically straps the horizontal segments on the counter electrode to the same electrical signal. It is sealed to the glass in a manner identical to the active HSC.

The other π-cell is assembled in an identical fashion except that the common HSC is assembled first and the active assembled second so that when the two π-cells are assembled together the active connector from one matches up with the common connector from the other.

Figure 1:
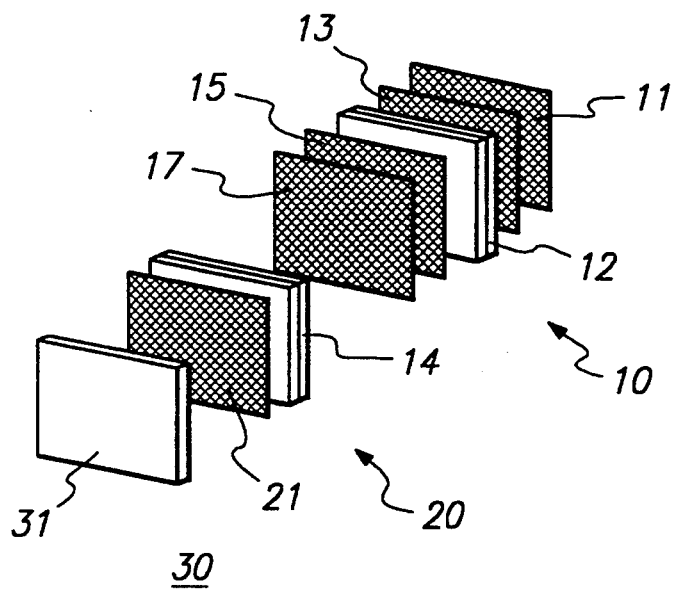
FIG. 1 is an exploded pictorial view of a liquid crystal shutter.
Figure 2:
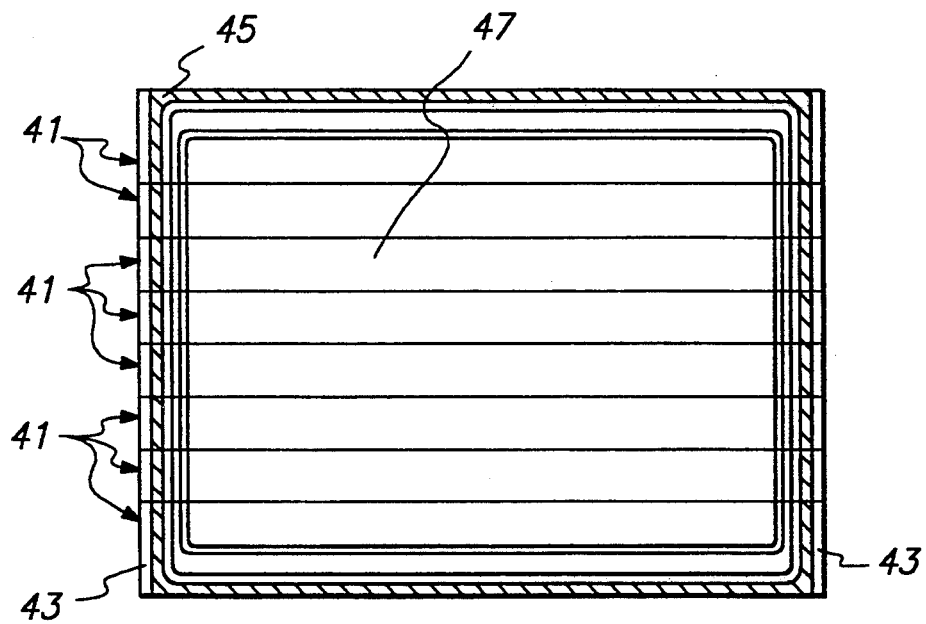
FIG. 2 is a plan view of the assembled liquid crystal shutter of FIG. 1.
Figure 3A:
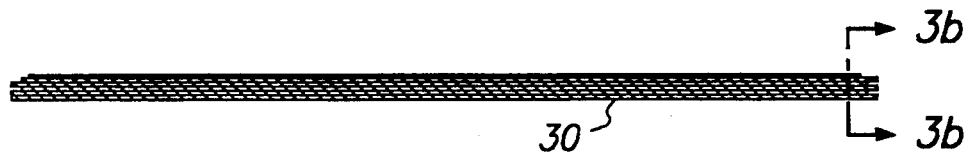
FIG. 3a is a sectional view of the liquid crystal shutter of FIG. 2.
Figure 3B:
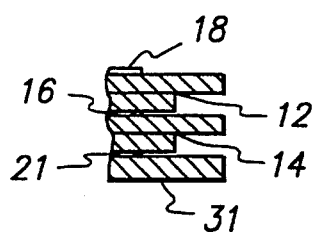

The two π-cells are assembled as shown in FIG. 1. Given the way in which the LCS has been assembled, the common connector from the first π-cell matches with the active connector from the second π-cell, and the common connector from the second π-cell matches with the active connector from the first π-cell. In this manner, the common connector from the first π-cell and the active connector from the second π-cell can be sealed simultaneously to the flexible printed circuit in one operation lasting 6–10 seconds. A second identical operation step is required to seal the active connector from the first π-cell and the common connector from the second π-cell to a second FPC. Both FPCs are identical to each other, as are the active connectors of the respective π-cells and the common connectors of the respective π-cells. The path size of the edge connection of the common HSC is made large enough to allow for a slight misregistration on the order of ±1 mm. The FPC may therefore be registered manually to the active HSC and the common HSC will mate properly due to its larger size tolerance.

The attachment of the antireflection coated glass is optional depending on the overall system contrast required. In addition, some applications may require the use of an optical coupling material between the two π-cells so as to reduce strain and internal reflections.

The space between sheets of glass that can accommodate connectors is only about 1.1 mm high. Such a small space makes it difficult if not impossible to make connections to the glass after final assembly. Connections to each π-cell must therefore be made prior to final assembly. Making connections prior to final assembly offers the additional advantage of being able to conduct testing prior to final assembly. By attaching a flat style connector to each π-cell prior to assembly of the LCS, the difficulty of making connections to the glass with conventional lead frames is avoided, as is the danger of electrical shorts.

Numerous variations of the described connector arrangement are possible depending on subsystem requirements. For example, flexible printed circuits with copper traces may be used instead of the HSCs with their silver traces. The traces may then be made narrower, allowing for the FPC with terminating connector to be made smaller. In this case, an anisotropic conductive sealing tape must be used to allow a mechanical bond and electrical connection to the ITO coated glass to be formed. The resulting connection system would provide higher reliability but at a higher cost due to the higher cost of FPCs over HSCs.

The HSCs, instead of attaching to an FPC may instead attach directly to a printed circuit board. Such a connector arrangement may in some instances integrate well into an overall system design and would enable costs savings to be achieved.

Alternatively, an FPC ribbon cable may be used to attach directly to the HSC and interface to a connector mounted on a remote printed circuit board.

In the described connection system, only three unique parts are required for making the connections; one active HSC, one common HSC and one FPC with mounted header. The screen-printed silver traces to the active HSC are drawn at 2 mm width. The pad area making contact to the ITO is approximately 12×3 mm. These dimensions are sufficient to maintain an overall lead trace resistance to each segment of no more than one ohm. If an FPC is used with anisotropic conductive tape, the lead traces can be shrunk to 1 mm rather than 2 mm, since the sheet resistance of copper is much lower than that of silver.

The connector system requires a minimal number of assembly steps and a minimum amount of time per assembly step. Mounting the HSCs to the two π-cells requires a total of four identical heat seal operations. Mounting the FPCs to the shutter requires two identical heat seal operations. The operations are sufficiently similar that they lend themselves well to automation. Each attaching step is only 6–8 seconds in duration. There are a total of six such steps. Since the attachment operations are nearly identical, overhead time (setup, loading and unloading) can be minimized.

The overall connector system design is small and compact and provides for easy integration into a computer or other electronic system. For easy integration, it is important to terminate the connectors into a connector which lends itself to simple manual assembly. Surface mounting the ten pin header on the FPC provides this capability.

The foregoing has described the principles, preferred embodiments and modes of operation of the present invention. However, the invention should not be construed as limited to the particular embodiments discussed. Instead, the above described embodiments should be regarded as illustrative rather than restrictive, and it should be appreciated that variations may be made in the embodiments by workers skilled in the art without departing from the scope of the present invention as defined by the following claims.

What is claimed is:

1. A method of making connections to a display apparatus including a plurality of flat panel display cells each having opposed active and common substrates, each of the active and common substrates having a plurality of electrodes defined thereon, the method comprising the steps of:
   a) placing one of the display cells in a heat sealing machine;
   b) placing a heat seal connector over an edge of one of an active substrate and a common substrate of the display cell;
   c) bringing a heat fixture into contact with the heat sealing connector to heat seal the connector to the substrate;
   d) turning over the display cell and replacing the display cell in the heat sealing machine;
   e) placing a heat seal connector over an edge of a different one of said active and said common substrate of the display cell;
   f) bringing a heat fixture into contact with the heat seal connector to heat seal the connector to the substrate;
   g) repeating steps a) through f) for remaining display cells;
   h) fixing said display cells in overlapping relation to one another;
   i) heat sealing to a first printed circuit a heat seal connector sealed to the active substrate of one display cell and a heat seal connector sealed to the common substrate of another display cell; and
   j) heat sealing to a second printed circuit a heat seal connector sealed to the active substrate of said another display cell and a heat seal connector sealed to the common substrate of said one display cell.

2. An apparatus comprising:
   a plurality of flat panel display cells each comprising opposed active and common substrates, said flat panel display cells being fixed in overlapping relation to one another, each of said active and common substrates having a first edge and a second opposite edge and having a plurality of electrodes defined thereon extending between an area adjacent said first edge and an area adjacent said second edge;
   first printed circuit means connected to connector means having conductive paths which connect to an active substrate of one of said flat panel display cells and to connector means having conductive paths which connect to a common substrate of another of said flat panel display cells; and
   second printed circuit means connected to connector means having conductive paths which connect to an active substrate of said another of said flat panel display cells and to connector means having conductive paths which connect to a common substrate of said one of said flat panel display cells.

3. The apparatus of claim 2, wherein one of said printed circuit means is connected to a heat seal connector means of said first type connected along said first edge and a heat seal connector means of said second type connected along said first edge.

4. The apparatus of claim 3, wherein another one of said printed circuit means is connected to a heat seal connector means of said first type connected along said second edge and a heat seal connector means of said second type connected along said second edge.

5. The apparatus of claim 2, wherein each of said heat seal connector means of said first type comprises a plurality of conductive paths equal in number to said plurality of electrodes.

6. The apparatus of claim 5, wherein each of said heat seal connector means of said second type comprises only a single conductive path.

7. The apparatus of claim 2, wherein each of said connector means comprises heat seal connector means.

8. The apparatus of claim 7, wherein each of said plurality of heat seal connector means is of one of a first type of heat seal connector means having a first pattern of one or more conductive paths and a second type of heat seal connector means having a second pattern of one or more conductive paths.

9. The apparatus of claim 8, wherein each heat seal connector means of said first type is connected to one of said active substrates along one of said first and second edges and each heat seal connector means of said second type is connected to one of said common substrates along one of said first and second edges.

10. The apparatus of claim 9, wherein each of said plurality of printed circuit means is connected to at least one heat seal connector means of said first type and at least one heat seal connector means of said second type.

11. The apparatus of claim 10, wherein each of said plurality of printed circuit means has a same pattern of conductive paths defined thereon and each is provided with a header for connecting to control circuitry.

12. The apparatus of claim 2, wherein each of said plurality of printed circuit means has a same pattern of conductive paths defined thereon and each is provided with a header for connecting to control circuitry.

* * * * *

UNITED STATES PATENT AND TRADEMARK OFFICE
CERTIFICATE OF CORRECTION

PATENT NO. : 5,450,222
DATED : September 12, 1995
INVENTOR(S) : Eric R. SIRKIN

It is certified that error appears in the above-indentified patent and that said Letters Patent is hereby corrected as shown below:

Column 8, line 4, delete "fiat" and insert --flat--.

Signed and Sealed this

Second Day of April, 1996

Attest:

BRUCE LEHMAN

Attesting Officer

Commissioner of Patents and Trademarks